US012412612B1

(12) United States Patent
Tong et al.

(10) Patent No.: US 12,412,612 B1
(45) Date of Patent: Sep. 9, 2025

(54) METHOD FOR OPERATING A DYNAMIC MEMORY STRUCTURE HAVING A WRITE GATING DEVICE, A READ GATING DEVICE, AND A CAPACITOR

(71) Applicant: Huazhong University of Science and Technology, Wuhan (CN)

(72) Inventors: Hao Tong, Wuhan (CN); Binhao Wang, Wuhan (CN); Xiangshui Miao, Wuhan (CN)

(73) Assignee: Huazhong University of Science and Technology, Wuhan (CN)

( * ) Notice: Subject to any disclaimer, the term of this patent is extended or adjusted under 35 U.S.C. 154(b) by 0 days.

(21) Appl. No.: 19/019,732

(22) Filed: Jan. 14, 2025

(30) Foreign Application Priority Data

Nov. 8, 2024 (CN) .......................... 202411588076.0

(51) Int. Cl.
*G11C 11/36* (2006.01)
(52) U.S. Cl.
CPC .................................... *G11C 11/36* (2013.01)
(58) Field of Classification Search
CPC ....................................................... G11C 11/36
USPC .......................................................... 365/149
See application file for complete search history.

(56) References Cited

U.S. PATENT DOCUMENTS

| | | | | |
|---|---|---|---|---|
| 6,577,548 | B1* | 6/2003 | Barth, Jr. ............. | G11C 11/4076 365/194 |
| 8,487,303 | B2* | 7/2013 | Takemura .......... | G11C 16/0483 257/296 |
| 11,450,371 | B2* | 9/2022 | Kimura .................. | H10D 87/00 |
| 12,082,391 | B2* | 9/2024 | Ohshita ................. | H10D 86/60 |
| 2024/0379159 | A1* | 11/2024 | Tong ..................... | G11C 13/004 |

* cited by examiner

*Primary Examiner* — Connie C Yoha
(74) *Attorney, Agent, or Firm* — WCF IP

(57) ABSTRACT

Provided is a dynamic memory structure and an operating method thereof. The dynamic memory structure includes a write gating device, a read gating device, and a capacitor. A first terminal of the write gating device, a first terminal of the read gating device, and a first terminal of the capacitor are connected together; a second terminal of the write gating device is a data writing end; a second terminal of the read gating device is a data reading end; and a second terminal of the capacitor is a gating end and connected to a word line. The write gating device and the read gating device are both unidirectionally conducted, and conduction modes of the write gating device and the read gating device are both threshold-on. A conduction threshold voltage of the write gating device is less than a conduction threshold voltage of the read gating device.

12 Claims, 3 Drawing Sheets

METHOD FOR OPERATING A DYNAMIC MEMORY STRUCTURE HAVING A WRITE GATING DEVICE, A READ GATING DEVICE, AND A CAPACITOR

CROSS REFERENCE TO RELATED APPLICATION

This patent application claims the benefit and priority of Chinese Patent Application No. 2024115880760, filed with the China National Intellectual Property Administration on Nov. 8, 2024, the disclosure of which is incorporated by reference herein in its entirety as part of the present application.

TECHNICAL FIELD

The present disclosure relates to the technical field of memories, and in particular, to a dynamic memory structure and an operating method thereof.

BACKGROUND

As the demand for higher performance and smaller size of electronic devices continues to grow, the design and manufacture of dynamic random access memories (DRAMs) faces unprecedented challenges. The DRAMs rely on capacitors to store data, but as their sizes continue to shrink, it becomes increasingly difficult to maintain sufficient storage capacity and stability. Density problem: as the Moore's Law advances, the density of the memories needs to increase exponentially. However, when the DRAM's capacitors are shrunk to the nanometer scale, they face the quantum tunneling effect, which may lead to data loss. Additionally, the shrinking physical size of the capacitors limits their ability to store electric charges, thus affecting the storage density. Size miniaturization dilemma: to improve the integration level and reduce costs, the DRAM manufacturing process needs to continuously miniaturize the DRAMs. However, when the size shrinks to a certain extent, the complexity and cost of the manufacturing process increase significantly. For example, the photolithography in the manufacturing process encounters resolution limitations at smaller scales, making manufacturing more difficult.

In 2022, Huazhong University of Science and Technology disclosed a novel dynamic storage device structure (CN2021112803491), which provides a feasible solution for the next generation of high-density dynamic memories. The basic structure of the novel dynamic storage device structure is one-selector one-resistor (1S1R), and consists of an ovonic threshold switch (OTS) selector connected in series with a capacitor. An OTS is employed to control the charging and discharging of the capacitor to achieve the function of data storage. Thanks to its simple structure and loose material conditions, three-dimensional stacking similar to a 3D NAND structure can be achieved. However, due to the large leakage current of the OTS selector itself, its data hold time is less than 1 ms. This shortcoming may limit its further application.

SUMMARY

An objective of the present disclosure is to provide a dynamic memory structure and an operating method thereof, which can solve the problem of short data hold time faced by existing 1S1C memories.

To achieve the above objective, the present disclosure provides the following solutions.

In a first aspect, the present disclosure provides a dynamic memory structure, where the dynamic memory structure includes a write gating device, a read gating device, and a capacitor, where a first terminal of the write gating device, a first terminal of the read gating device, and a first terminal of the capacitor are connected together; a second terminal of the write gating device is a data writing end; a second terminal of the read gating device is a data reading end; a second terminal of the capacitor is a gating end and connected to a word line;

the write gating device and the read gating device are both unidirectionally conducted, and conduction modes of the write gating device and the read gating device are both threshold-on; the threshold-on means that only when a potential of the second terminal of the write gating device is higher than a potential of the first terminal of the write gating device by a conduction threshold voltage of the write gating device, the write gating device is conducted, and a current flows from the second terminal of the write gating device to the first terminal of the write gating device, or otherwise the write gating device remains in a turned-off state; only when a potential of the first terminal of the read gating device is higher than a potential of the second terminal of the read gating device by a conduction threshold voltage of the read gating device, the read gating device is conducted, and a current flows from the first terminal of the read gating device to the second terminal of the read gating device, or otherwise the read gating device remains in a turned-off state, where the conduction threshold voltage of the write gating device is less than the conduction threshold voltage of the read gating device.

Optionally, when data writing is required, a write pulse signal is applied between the second terminal of the write gating device and the second terminal of the capacitor; the potential of the second terminal of the write gating device is higher than a potential of the second terminal of the capacitor; and a difference between a voltage of the write pulse signal and a capacitor voltage in an initial state is higher than the conduction threshold voltage of the write gating device.

Optionally, when data reading is required, a read pulse signal is applied between the second terminal of the read gating device and the second terminal of the capacitor; the potential of the second terminal of the read gating device is less than a potential of the second terminal of the capacitor; and when the capacitor stores a capacitor voltage after the data writing is completed, currents are generated at two ends of the capacitor, and when the capacitor stores a capacitor voltage in an initial state, no current is generated at the two ends of the capacitor.

Optionally, information is stored in the capacitor in an electric charge form.

Optionally, the write gating device has a first hold voltage in a conduction direction, and the first hold voltage is less than or equal to the conduction threshold voltage of the write gating device.

Optionally, the read gating device has a second hold voltage in a conduction direction, and the second hold voltage is less than or equal to the conduction threshold voltage of the read gating device.

Optionally, the write gating device and the read gating device are gating devices having unidirectional threshold switch characteristics.

In a second aspect, the present disclosure provides an operating method of the dynamic memory structure, where the operating method of the dynamic memory structure includes: when the data writing is required, applying the write pulse signal between the second terminal of the write gating device and the second terminal of the capacitor, where the potential of the second terminal of the write gating device is higher than the potential of the second terminal of the capacitor, and the difference between the voltage of the write pulse signal and the capacitor voltage in the initial state is higher than the conduction threshold voltage of the write gating device; and when the data reading is required, applying the read pulse signal between the second terminal of the read gating device and the second terminal of the capacitor, where the potential of the second terminal of the read gating device is less than the potential of the second terminal of the capacitor; and when the capacitor stores the capacitor voltage after the data writing is completed, the currents are generated at the two ends of the capacitor, and when the capacitor stores the capacitor voltage in the initial state, no current is generated at the two ends of the capacitor.

Optionally, after the data writing is completed, a voltage calculation equation of the capacitor is:

$$Vc1 = Vwrite - Vhold1,$$

where Vc1 is the capacitor voltage after the data writing is completed, Vwrite is the voltage of the write pulse signal, and Vhold1 is the first hold voltage.

Optionally, when a data reading operation is required, a read voltage pulse meets the following relationship:

$$Vread + Vc0 < Vth2, \text{ and}$$

$$Vread + Vc1 > Vth2,$$

where Vread is the read voltage pulse, Vc0 is the capacitor voltage in the initial state, Vc1 is the capacitor voltage after the data writing is completed, and Vth2 is the conduction threshold voltage of the read gating device.

According to specific embodiments provided in the present disclosure, the present disclosure discloses the following technical effects:

The present disclosure provides a dynamic memory structure and an operating method thereof. The dynamic memory structure includes a write gating device, a read gating device, and a capacitor. A first terminal of the write gating device, a first terminal of the read gating device, and a first terminal of the capacitor are connected together; a second terminal of the write gating device is a data writing end; a second terminal of the read gating device is a data reading end; and a second terminal of the capacitor is a gating end and connected to a word line. The write gating device and the read gating device are both unidirectionally conducted, and conduction modes of the write gating device and the read gating device are both threshold-on. A conduction threshold voltage of the write gating device is less than a conduction threshold voltage of the read gating device. According to the present disclosure, the structure of the conventional 1S1C memory is improved. Originally, data writing and reading share a same gating device, so the gating device must be bidirectionally conducted. However, there are very few types of bidirectionally conducted gating devices, resulting in very few types of gating devices that can be selected for the 1S1C memory. According to the present disclosure, dedicated gating devices are respectively configured for writing and reading, and the gating devices only need to have unidirectional threshold switch characteristics, greatly increasing the types of gating devices that can be selected for the memory. Moreover, the conduction threshold voltage of the write gating device is less than the conduction threshold voltage of the read gating device, such that the sub-threshold leakage current of the read gating device can be greatly reduced, and electric charges in the capacitor can be stored for a longer time, thereby prolonging the data retention time of the memory.

BRIEF DESCRIPTION OF THE DRAWINGS

To describe the technical solutions in the embodiments of the present disclosure or in the prior art more clearly, the accompanying drawings required for the embodiments are briefly described below. Apparently, the accompanying drawings in the following description show merely some embodiments of the present disclosure, and persons of ordinary skill in the art may still derive other accompanying drawings from these accompanying drawings without creative efforts.

REFERENCE NUMERALS

1—Second terminal of a write gating device, 2—Second terminal of a read gating device, 3—Second terminal of a capacitor, 4—Write gating device, 5—Read gating device, and 6—Capacitor.

DETAILED DESCRIPTION OF THE EMBODIMENTS

The technical solutions of the embodiments of the present disclosure are clearly and completely described below with reference to the drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts should fall within the protection scope of the present disclosure.

To make the above-mentioned objective, features, and advantages of the present disclosure clearer and more comprehensible, the present disclosure will be further described in detail below in conjunction with the accompanying drawings and specific embodiments.

Figure 1:
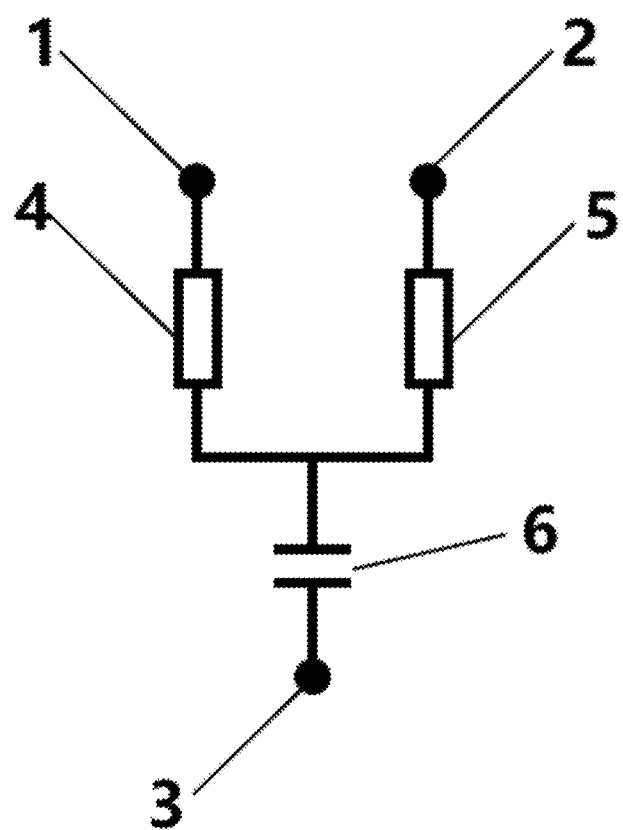
FIG. 1 is a structural diagram of a dynamic memory structure according to one embodiment of the present disclosure.

In one exemplary embodiment, as shown in FIG. 1, the present disclosure provides a dynamic memory structure. The dynamic memory structure includes a write gating device 4, a read gating device 5, and a capacitor 6.

A first terminal of the write gating device, a first terminal of the read gating device, and a first terminal of the capacitor are connected together, and a connecting point of the three end points is a storage node (SN) of a memory. Logic information is stored in the capacitor in an electric charge form. A second terminal 1 of the write gating device is a data writing end, a second terminal 2 of the read gating device is a data reading end, and a second terminal 3 of the capacitor is a gating end and connected to a word line.

The write gating device 4 and the read gating device 5 are both unidirectionally conducted, and conduction modes of the write gating device 4 and the read gating device 5 are both threshold-on. The threshold-on means that only when a potential of the second terminal 1 of the write gating device is higher than a potential of the first terminal of the write gating device 4 by a conduction threshold voltage of the write gating device 4, the write gating device 4 is conducted, and a current flows from the second terminal 1 of the write gating device to the first terminal of the write gating device 4, or otherwise the write gating device 4 remains in a turned-off state; only when a potential of the first terminal of the read gating device 5 is higher than a potential of the second terminal 2 of the read gating device by a conduction threshold voltage of the read gating device 5, the read gating device 5 is conducted, and a current flows from the first terminal of the read gating device 5 to the second terminal 2 of the read gating device, or otherwise the read gating device 5 remains in a turned-off state, where the conduction threshold voltage of the write gating device 4 is less than the conduction threshold voltage of the read gating device 5.

The conduction threshold voltage of the read gating device 5 is greater than the conduction threshold voltage of the write gating device 4, it means that under a same voltage load, a leakage current of the read gating device 5 is less than a leakage current of the write gating device 4, such that the storage time of electric charges in the capacitor can be prolonged, and the refresh time of the dynamic memory can be shortened.

The conventional 1S1C dynamic memory employs only one gating device to control the charging and discharging of the capacitor. When data is written, the electric charges flow into the capacitor through the gating device to achieve the information storage function. When the data is read, the electric charges flow out of the capacitor through the gating device to achieve the information reading function. Therefore, the gating device must be able to be conducted forwards to write the data and conducted reversely to read the data. The gating device needs to have the ability of bidirectional threshold conduction. Currently, the only device that can achieve bidirectional threshold conduction is the OTS selector. The forward and reverse threshold voltages of the OTS selector are basically consistent with a sub-threshold curve, and a sub-threshold leakage current of the OTS selector cannot be ignored. When data information is stored in the capacitor, the end of the capacitor connected to the OTS selector will have a high potential, which will cause the OTS selector to produce a large sub-threshold leakage. Therefore, the information stored in the capacitor will gradually be lost with the sub-threshold leakage. Therefore, the information stored in the capacitor usually needs to be rewritten once every 1 ms.

According to the present disclosure, the structure of the conventional 1S1C memory is improved, and dedicated gating devices are respectively configured for writing and reading. The write gating device 4 and the read gating device 5 can employ all gating devices having unidirectional threshold switch characteristics, greatly increasing the types of gating devices that can be selected by the memory, such as: a PN junction, a CBTS device, and a unidirectional conducted OTS device, all of which have the ability of unidirectional threshold conduction. By adjusting the threshold voltages of the read gating device 5 and the write gating device 4, the conduction threshold voltage of the write gating device 4 is less than the conduction threshold voltage of the read gating device 5. In this way, the information written into the capacitor through the write gating device 4 will generate a smaller sub-threshold leakage in the read gating device 5, thereby increasing the hold time of electric charges in the capacitor, reducing the refresh frequency of the dynamic memory, and improving the performance of the dynamic memory.

Both the write gating device 4 and the read gating device 5 can only be unidirectionally conducted, it means that a voltage is applied in a direction opposite to a gating device conduction direction, and the gating device is always in an off state and a high-resistance state.

Conduction modes of the write gating device 4 and the read gating device 5 are both threshold-on. The threshold-on means that when the applied voltage reaches a threshold voltage in the gating device conduction direction, a current jump phenomenon occurs.

In one exemplary embodiment, when data writing is required, a write pulse signal is applied between the second terminal 1 of the write gating device and the second terminal 3 of the capacitor; the potential of the second terminal 1 of the write gating device is higher than a potential of the second terminal 3 of the capacitor; and a difference between a voltage of the write pulse signal and a capacitor voltage in an initial state is higher than the conduction threshold voltage of the write gating device 4. The write pulse signal can enable the write gating device 4 to be turned on, the write gating device 4 becomes a low-resistance state, and the capacitor 6 can be charged to write information.

The write pulse signal minus the capacitor voltage in the initial state should be higher than the conduction threshold voltage of the write gating device 4. At this time, the write gating device 4 is conducted to charge the capacitor to complete the data writing. After the writing is completed, a calculation formula of the capacitor voltage is:

$$Vc1 = Vwrite - Vhold1,$$

where Vc1 is the capacitor voltage after the data writing is completed, Vwrite is the voltage of the write pulse signal, and Vhold1 is the first hold voltage. The capacitor voltage in the initial state and the capacitor voltage after the data writing is completed respectively correspond to two logic states of storage.

In one exemplary embodiment, when data reading is required, a read pulse signal is applied between the second terminal 2 of the read gating device and the second terminal 3 of the capacitor; the potential of the second terminal 2 of the read gating device is less than a potential of the second terminal 3 of the capacitor; and when the capacitor 6 stores a capacitor voltage after the data writing is completed, currents are generated at two ends of the capacitor 6, and when the capacitor 6 stores a capacitor voltage in an initial state, no current is generated at the two ends of the capacitor 6.

When a data reading operation is required, a read voltage pulse meets the following relationship:

$$Vread + Vc0 < Vth2, \text{ and}$$

$$Vread + Vc1 > Vth2,$$

where Vread is the read voltage pulse, Vc0 is the capacitor voltage in the initial state, Vc1 is the capacitor voltage after the data writing is completed, and Vth2 is the conduction threshold voltage of the read gating device.

When a memory cell stores a capacitor voltage state after the data writing is completed, the read pulse signal can enable the read gating device 5 to be turned on, and currents are generated at two ends of the memory cell. When the memory cell stores a capacitor voltage state in the initial state, the read pulse signal cannot enable the read gating device 5 to be turned on, and no current is generated at the two ends of the memory cell. The information stored in the memory can be determined by determining whether a read current is generated. At the same time, the information stored in the dynamic memory is stored in the capacitor 6 in an electric charge form. The storage state can be determined by distinguishing the amount of electric charges stored in the capacitor 6.

In one exemplary embodiment, the stored information is stored in the capacitor 6 in an electric charge form. The storage state can be determined by distinguishing the amount of electric charges stored in the capacitor 6.

In one exemplary embodiment, the write gating device 4 has a first hold voltage in a conduction direction, and the first hold voltage is less than or equal to the conduction threshold voltage of the write gating device 4. The read gating device 5 has a second hold voltage in a conduction direction, and the second hold voltage is less than or equal to the conduction threshold voltage of the read gating device 5.

In another exemplary embodiment of the present disclosure, an operating method of the dynamic memory structure is provided. The operating method of the dynamic memory structure includes: when the data writing is required, the write pulse signal is applied between the second terminal 1 of the write gating device and the second terminal 3 of the capacitor, where the potential of the second terminal 1 of the write gating device is higher than the potential of the second terminal 3 of the capacitor, and the difference between the voltage of the write pulse signal and the capacitor voltage in the initial state is higher than the conduction threshold voltage of the write gating device 4. The write pulse signal can enable the write gating device 4 to be turned on, the write gating device 4 becomes a low-resistance state, and the capacitor 6 can be charged to write information.

When data reading is required, a read pulse signal is applied between the second terminal 2 of the read gating device and the second terminal 3 of the capacitor; the potential of the second terminal 2 of the read gating device is less than a potential of the second terminal 3 of the capacitor; and when the capacitor 6 stores a capacitor voltage after the data writing is completed, currents are generated at two ends of the capacitor 6, and when the capacitor 6 stores a capacitor voltage in an initial state, no current is generated at the two ends of the capacitor 6.

As an optional implementation, after the data writing is completed, a voltage calculation equation of the capacitor is:

$$Vc1 = Vwrite - Vhold1,$$

where Vc1 is the capacitor voltage after the data writing is completed, Vwrite is the voltage of the write pulse signal, and Vhold1 is the first hold voltage. The capacitor voltage in the initial state and the capacitor voltage after the data writing is completed respectively correspond to two logic states of storage.

As an optional implementation, when a data reading operation is required, a read voltage pulse meets the following relationship:

$$V\text{read} + Vc0 < Vth2, \text{ and}$$

$$V\text{read} + Vc1 > Vth2,$$

where Vread is the read voltage pulse, Vc0 is the capacitor voltage in the initial state, Vc1 is the capacitor voltage after the data writing is completed, and Vth2 is the conduction threshold voltage of the read gating device.

When a memory cell stores a capacitor voltage state after the data writing is completed, the read pulse signal can enable the read gating device 5 to be turned on, and currents are generated at two ends of the memory cell. When the memory cell stores a capacitor voltage state in the initial state, the read pulse signal cannot enable the read gating device 5 to be turned on, and no current is generated at the two ends of the memory cell. The information stored in the memory can be determined by determining whether a read current is generated. At the same time, the information stored in the dynamic memory is stored in the capacitor 6 in an electric charge form. The storage state can be determined by distinguishing the amount of electric charges stored in the capacitor 6.

In the present disclosure, the structure of the conventional 1S1C memory is improved. Originally, data writing and reading share a same gating device, so the gating device must be bidirectionally conducted. However, there are very few types of bidirectionally conducted gating devices, resulting in very few types of gating devices that can be selected for the 1S1C memory. According to the present disclosure, dedicated gating devices are respectively configured for writing and reading, and the gating devices only need to have unidirectional threshold switch characteristics, greatly increasing the types of gating devices that can be selected for the memory. Moreover, the conduction threshold voltage of the write gating device is less than the conduction threshold voltage of the read gating device, such that the sub-threshold leakage current of the read gating device can be greatly reduced, and electric charges in the capacitor can be stored for a longer time, thereby prolonging the data retention time of the memory.

Figure 2:
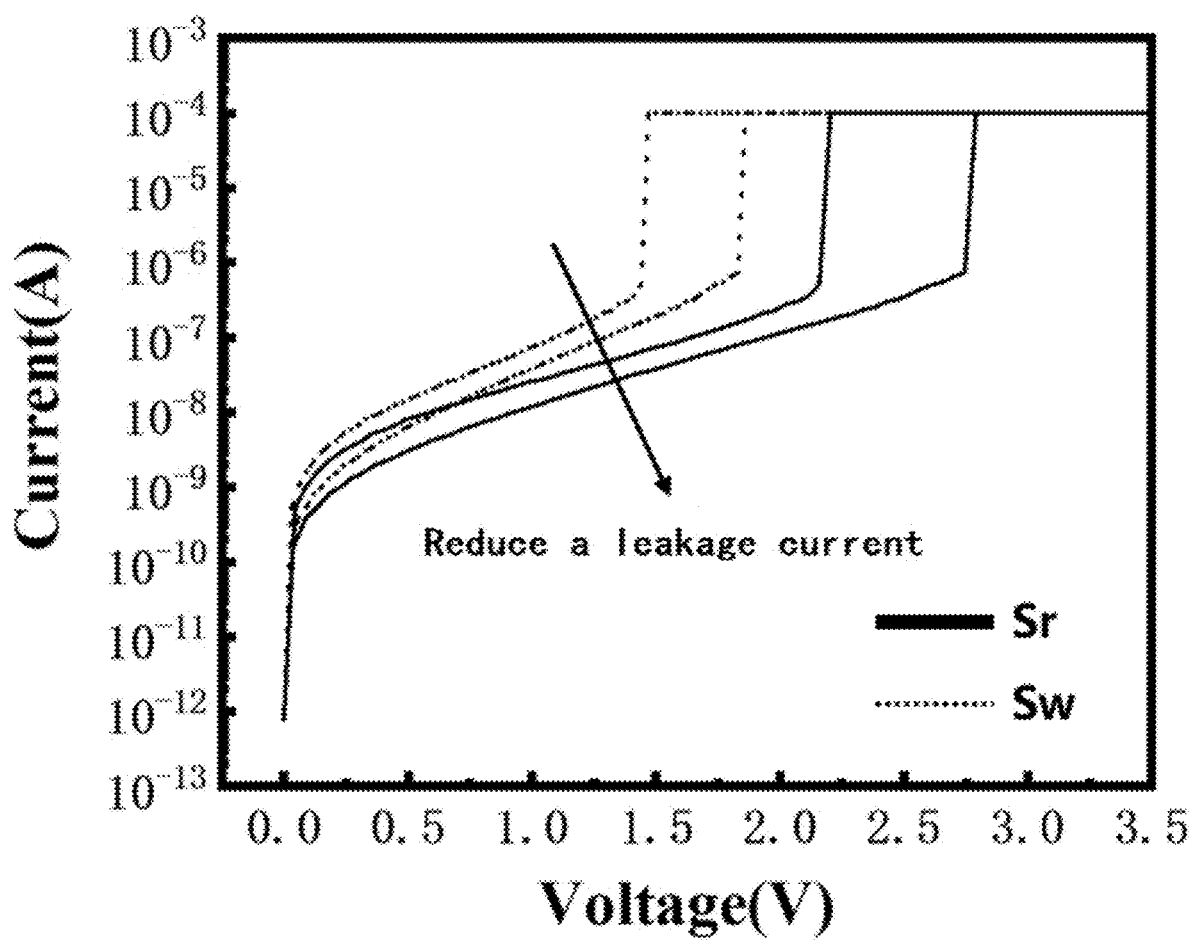
FIG. 2 is an I-V curve schematic diagram of a write gating device and a read gating device according to one embodiment of the present disclosure.
Figure 3:
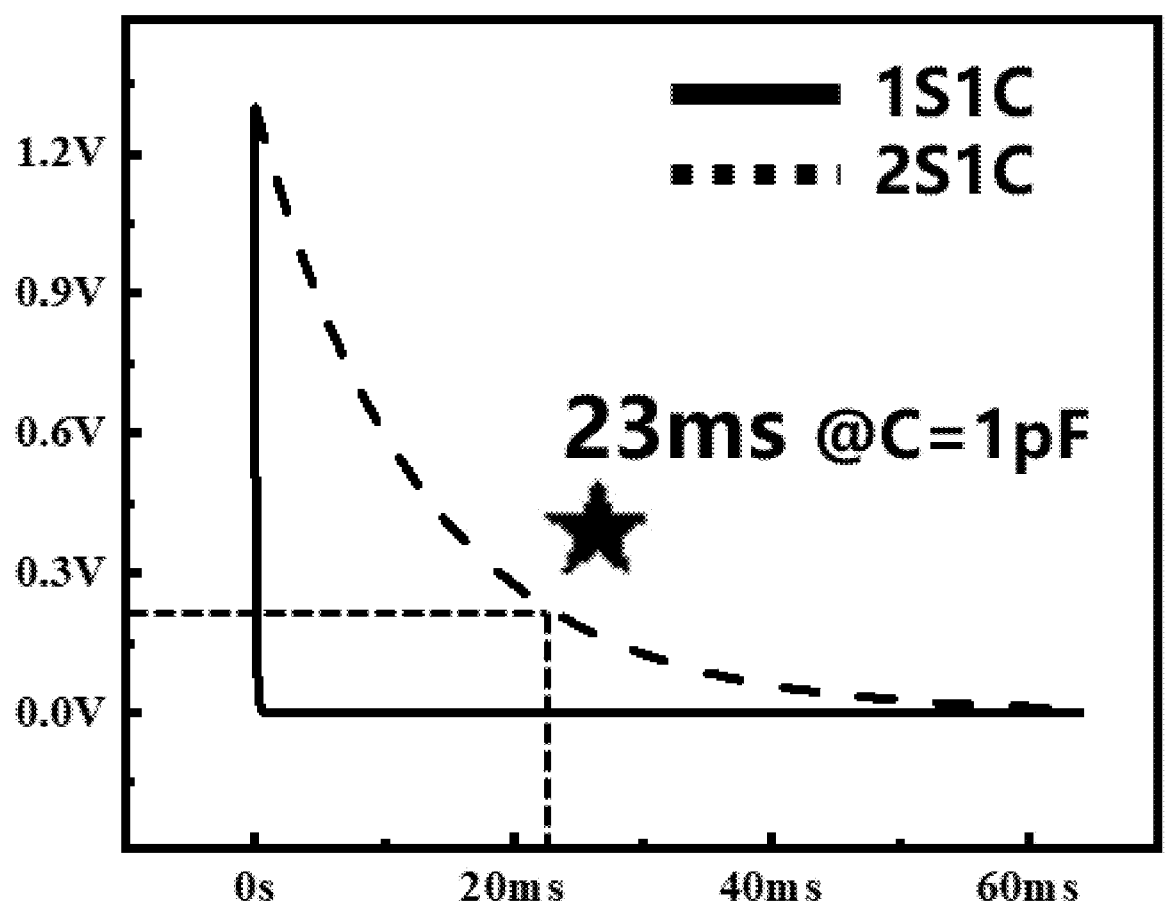
FIG. 3 is a comparison diagram of a data hold time implemented by a device structure according to one embodiment of the present disclosure.

Further detailed description is made below in combination with the preferred embodiments;

FIG. 2 illustrates an I-V characteristic curve of a write gating device and a read gating device employing the 2S1C unit structure provided in the present disclosure, where Sw is the write gating device, Sr is the read gating device, Sw means that the write gating device has a threshold voltage of about 1.75 V and a hold voltage of about 1.3 V, and Sr means that the read gating device has a threshold voltage of about 2.75 V and a hold voltage of about 2.1 V. The threshold voltage of the read gating device is higher than the threshold voltage of the write gating device, and under the same bias condition, the read gating device has a less leakage current than the wrote gating device. When a writing operation is executed, a writing voltage of 2.5 V is applied between the second terminal of the write gating device and the second terminal of the capacitor, and the voltage written into the capacitor is 2.5 V−1.3 V=1.2 V. After the writing is completed, for a bas generated by a capacitor potential, the write gating device is in a reverse off state at this time and has a very low leakage current. Therefore, the data storage time of the memory cell mainly depends on the read gating device. The read gating device is biased forwards at this time, and the leakage current is about 10 nA. Therefore, the memory cell has a longer data storage time. As shown in FIG. 3, when the capacitor voltage decays to 0.2 V, it is determined that the data in the memory cell is lost, and the memory cell can achieve a data hold time of 23 ms.

If the conventional 1S1C structure is employed, after the data writing is completed, the voltage of the capacitor is 1.2 V. For the bias generated by the capacitor potential, the leakage current of the gating device is about 100 nA at this time. Therefore, the memory cell will have a shorter data hold time. As shown in FIG. 3, the shown data hold time is less than 1 ms. Therefore, by means of the novel memory cell structure provided in the present disclosure, the data hold time of the novel dynamic memory can be greatly improved.

The present disclosure further provides an application scenario, in which the operating method of the dynamic memory structure is applied. Specifically, the operating method of the dynamic memory structure provided by this embodiment can be applied in a memory read/write scenario. The memory read/write scenario includes a data wiring link and a data reading link. When the data writing is required, the write pulse signal is applied between the second terminal of the write gating device and the second terminal of the capacitor; the potential of the second terminal of the write gating device is higher than the potential of the second terminal of the capacitor; and the difference between the voltage of the write pulse signal and the capacitor voltage in the initial state is higher than the conduction threshold voltage of the write gating device. when the data reading is required, applying the read pulse signal between the second terminal of the read gating device and the second terminal of the capacitor, where the potential of the second terminal of the read gating device is less than the potential of the second terminal of the capacitor; and when the capacitor stores the capacitor voltage after the data writing is completed, the currents are generated at the two ends of the capacitor, and when the capacitor stores the capacitor voltage in the initial state, no current is generated at the two ends of the capacitor.

The technical characteristics of the above embodiments can be employed in arbitrary combinations. To provide a concise description of these embodiments, all possible combinations of all the technical characteristics of the above embodiments may not be described; however, these combinations of the technical characteristics should be construed as falling within the scope defined by the specification as long as no contradiction occurs.

Specific examples are used herein to explain the principles and implementations of the present disclosure. The description of the examples is merely intended to help understand the method of the present disclosure and its core ideas. In addition, those of ordinary skill in the art can make various modifications to the specific implementations and application scope in accordance with the teachings of the present disclosure. In conclusion, the content of the description shall not be construed as limitations to the present disclosure.

What is claimed is:

1. An operating method of a dynamic memory structure, wherein the dynamic memory structure comprises a write gating device, a read gating device, and a capacitor, wherein
   a first terminal of the write gating device, a first terminal of the read gating device, and a first terminal of the capacitor are connected together; a second terminal of the write gating device is a data writing end; a second terminal of the read gating device is a data reading end; a second terminal of the capacitor is a gating end and connected to a word line;
   the write gating device and the read gating device are both unidirectionally conducted, and conduction modes of the write gating device and the read gating device are both threshold-on; the threshold-on means that only when a potential of the second terminal of the write gating device is higher than a potential of the first terminal of the write gating device by a conduction threshold voltage of the write gating device, the write gating device is conducted, and a current flows from the second terminal of the write gating device to the first terminal of the write gating device, or otherwise the write gating device remains in a turned-off state; and only when a potential of the first terminal of the read gating device is higher than a potential of the second terminal of the read gating device by a conduction threshold voltage of the read gating device, the read gating device is conducted, and a current flows from the first terminal of the read gating device to the second terminal of the read gating device, or otherwise the read gating device remains in a turned-off state, wherein the conduction threshold voltage of the write gating device is less than the conduction threshold voltage of the read gating device;
   wherein the operating method of the dynamic memory structure comprises:
   when data writing is required, applying the write pulse signal between the second terminal of the write gating device and the second terminal of the capacitor, wherein the potential of the second terminal of the write gating device is higher than the potential of the second terminal of the capacitor, and the difference between the voltage of the write pulse signal and the capacitor voltage in the initial state is higher than the conduction threshold voltage of the write gating device; and
   when the data reading is required, applying the read pulse signal between the second terminal of the read gating device and the second terminal of the capacitor, where the potential of the second terminal of the read gating device is less than the potential of the second terminal of the capacitor; and when the capacitor stores the capacitor voltage after the data writing is completed, the currents are generated at the two ends of the capacitor, and when the capacitor stores the capacitor voltage in the initial state, no current is generated at the two ends of the capacitor; and
   wherein after the data writing is completed, a voltage calculation equation of the capacitor is:

$$Vc1 = Vwrite - Vhold1,$$

wherein Vc1 is the capacitor voltage after the data writing is completed, Vwrite is the voltage of the write pulse signal, and Vhold1 is the first hold voltage.

2. The operating method of the dynamic memory structure according to claim 1, wherein when a data reading operation is required, a read voltage pulse meets the following relationship:

$$Vread + Vc0 < Vth2, \text{ and}$$

$$Vread + Vc1 > Vth2,$$

wherein Vread is the read voltage pulse, Vc0 is the capacitor voltage in the initial state, Vc1 is the capacitor voltage after the data writing is completed, and Vth2 is the conduction threshold voltage of the read gating device.

3. The operating method of the dynamic memory structure according to claim 1, wherein when data writing is required, a write pulse signal is applied between the second terminal of the write gating device and the second terminal of the capacitor; the potential of the second terminal of the write gating device is higher than a potential of the second terminal of the capacitor; and a difference between a voltage of the write pulse signal and a capacitor voltage in an initial state is higher than the conduction threshold voltage of the write gating device.

4. The operating method of the dynamic memory structure according to claim 1, wherein when data reading is required, a read pulse signal is applied between the second terminal of the read gating device and the second terminal of the capacitor; the potential of the second terminal of the read gating device is less than a potential of the second terminal of the capacitor; and when the capacitor stores a capacitor voltage after the data writing is completed, currents are generated at two ends of the capacitor, and when the capacitor stores a capacitor voltage in an initial state, no current is generated at the two ends of the capacitor.

5. The operating method of the dynamic memory structure according to claim 1, wherein information is stored in the capacitor in an electric charge form.

6. The operating method of the dynamic memory structure according to claim 1, wherein the write gating device has a first hold voltage in a conduction direction, and the first hold voltage is less than or equal to the conduction threshold voltage of the write gating device.

7. The operating method of the dynamic memory structure according to claim 1, wherein the read gating device has a second hold voltage in a conduction direction, and the second hold voltage is less than or equal to the conduction threshold voltage of the read gating device.

8. The operating method of the dynamic memory structure according to claim 1, wherein the write gating device and the read gating device are gating devices having unidirectional threshold switch characteristics.

9. The operating method of the dynamic memory structure according to claim 3, wherein when a data reading operation is required, a read voltage pulse meets the following relationship:

$$V\text{read}+Vc0<Vth2, \text{ and}$$

$$V\text{read}+Vc1>Vth2,$$

wherein Vread is the read voltage pulse, Vc0 is the capacitor voltage in the initial state, Vc1 is the capacitor voltage after the data writing is completed, and Vth2 is the conduction threshold voltage of the read gating device.

10. The operating method of the dynamic memory structure according to claim 4, wherein when a data reading operation is required, a read voltage pulse meets the following relationship:

$$V\text{read}+Vc0<Vth2, \text{ and}$$

$$V\text{read}+Vc1>Vth2,$$

wherein Vread is the read voltage pulse, Vc0 is the capacitor voltage in the initial state, Vc1 is the capacitor voltage after the data writing is completed, and Vth2 is the conduction threshold voltage of the read gating device.

11. The operating method of the dynamic memory structure according to claim 5, wherein when a data reading operation is required, a read voltage pulse meets the following relationship:

$$V\text{read}+Vc0<Vth2, \text{ and}$$

$$V\text{read}+Vc1>Vth2,$$

wherein Vread is the read voltage pulse, Vc0 is the capacitor voltage in the initial state, Vc1 is the capacitor voltage after the data writing is completed, and Vth2 is the conduction threshold voltage of the read gating device.

12. The operating method of the dynamic memory structure according to claim 6, wherein when a data reading operation is required, a read voltage pulse meets the following relationship:

$$V\text{read}+Vc0<Vth2, \text{ and}$$

$$V\text{read}+Vc1>Vth2,$$

wherein Vread is the read voltage pulse, Vc0 is the capacitor voltage in the initial state, Vc1 is the capacitor voltage after the data writing is completed, and Vth2 is the conduction threshold voltage of the read gating device.

* * * * *